Dec. 13, 1966 H. D. KITCHIN 3,292,104

AMPLITUDE CONTROL CIRCUIT FOR TRANSISTOR OSCILLATORS

Filed June 11, 1964 2 Sheets-Sheet 1

INVENTOR
Harry Donald Kitchin
BY Baldwin & Wight
ATTORNEYS

Dec. 13, 1966 H. D. KITCHIN 3,292,104

AMPLITUDE CONTROL CIRCUIT FOR TRANSISTOR OSCILLATORS

Filed June 11, 1964 2 Sheets-Sheet 2

INVENTOR

Harry Donald Kitchin

BY Baldwin & Wight

ATTORNEYS

United States Patent Office 3,292,104

Patented Dec. 13, 1966

3,292,104

AMPLITUDE CONTROL CIRCUIT FOR TRANSISTOR OSCILLATORS

Harry Donald Kitchin, Colchester, Essex, England, assignor to The Marconi Company Limited, London, England, a British company Filed June 11, 1964, Ser. No. 374,479

Claims priority, application Great Britain, June 24, 1963, 24,961/63

10 Claims. (Cl. 331—109)

This invention relates to amplitude control circuits for transistor oscillators. Though not limited to its application thereto the invention is very advantageously applicable to E.H.T. generators of the so-called R.F. type, i.e. of the type in which E.H.T. is produced by generating radio frequency oscillations and rectifying the same. In practice the load upon such an E.H.T. generator may vary over a wide range and it is a common requirement that the E.H.T. supplied shall be substantially constant at a desired controllable value despite such variations. The present invention enables a wide range of control to be obtained whilst satisfying this requirement.

Figure 2:
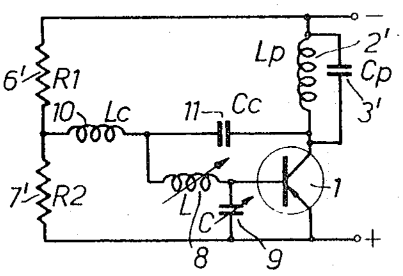
Figure 1:
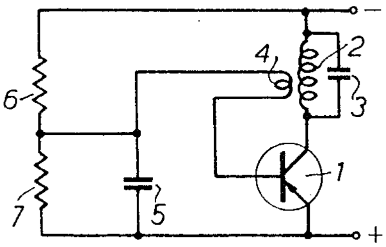
FIG. 1. PRIOR ART
Figure 3:
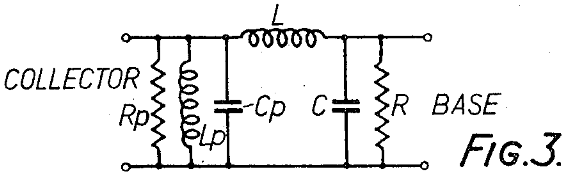
Figure 5:
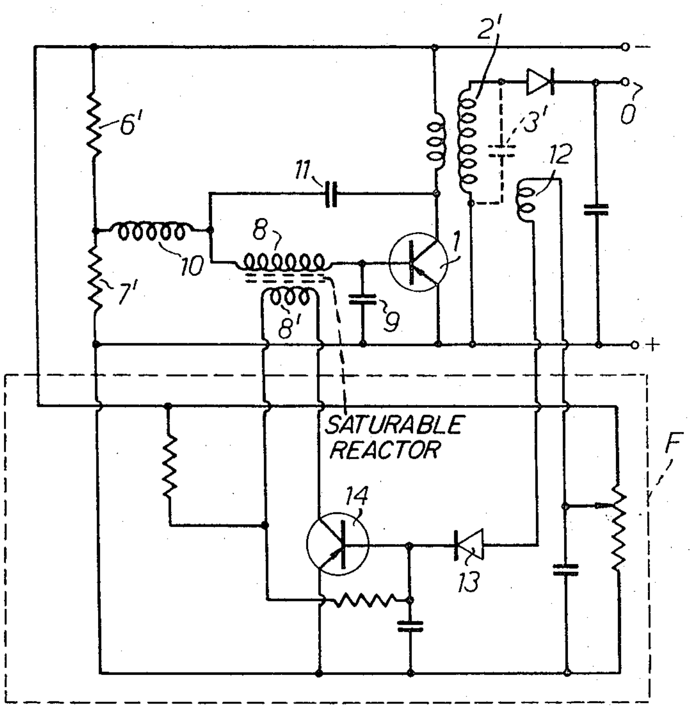
Figure 4:
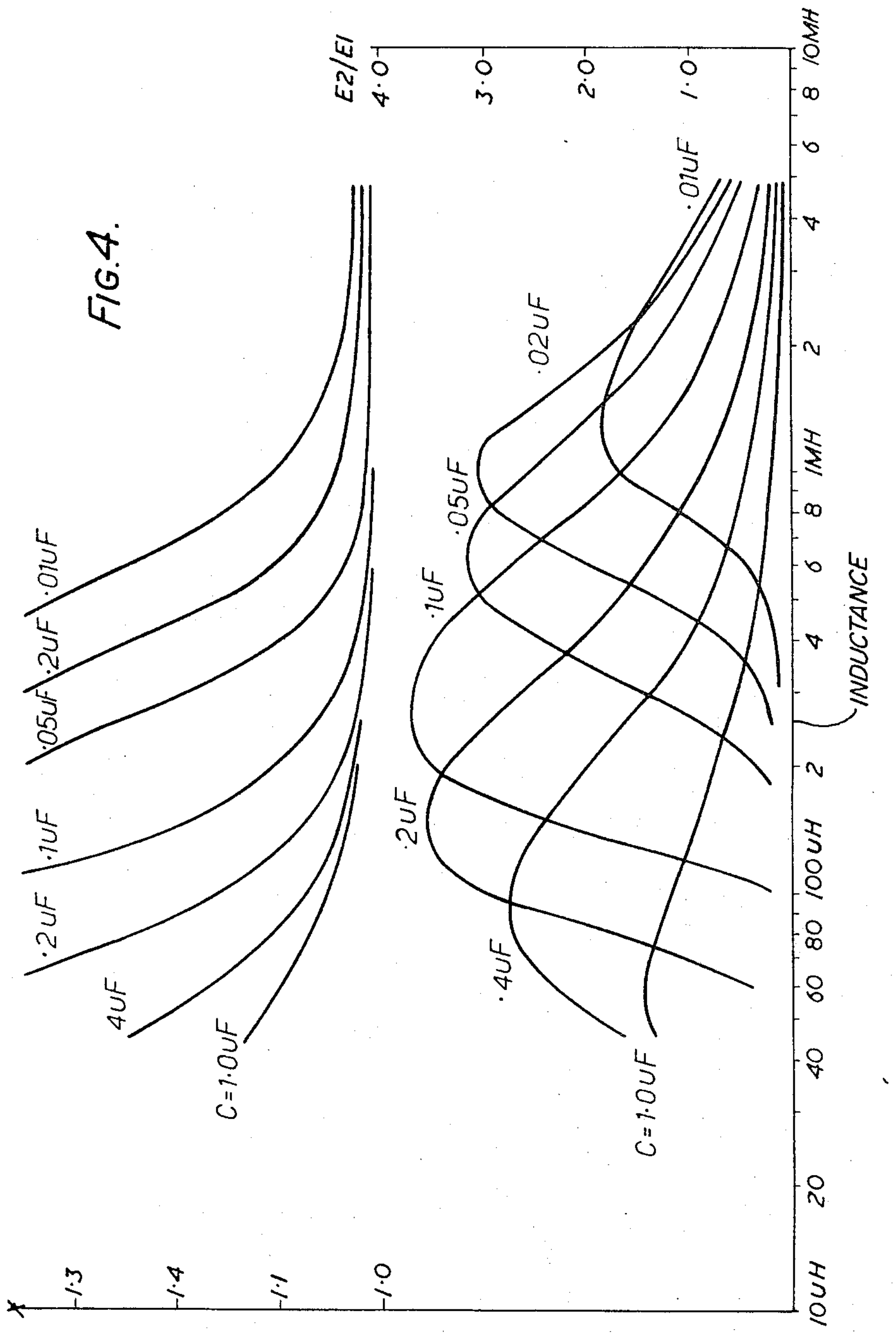

The invention is illustrated in and explained in connection with the accompanying drawings in which FIG. 1 is a simplified circuit diagram of a prior art transistor oscillator and is provided for purposes of explanation; FIG. 2 is a similarly simplified circuit diagram of an oscillator in accordance with this invention; FIG. 3 is a theoretical equivalent circuit diagram of FIG. 2; FIG. 4 is a set of curves relating to the operation of the invention; and FIG. 5 is a simplified circuit diagram of an E.H.T. generator embodying the invention.

Referring to FIG. 1 the prior art oscillator therein shown comprises a transistor 1 having in its collector circuit a tuned circuit consisting of inductance 2 and parallel capacitance 3, the former being coupled to an inductance 4 supplying feed back to the base circuit. The inductance 4 is as shown in series with a capacitance 5 between the base and the emitter. Two resistances 6 and 7 are in series between the operating potential supply terminals and the junction point of these resistances is connected to the junction point of the elements 4 and 5.

In this known circuit elements 6, 7, and 5 provide forward bias to ensure ready starting up of oscillations when the operating potential is applied, while the rectification action of the diode constituted by the base-emitter portion of the transistor establishes a reverse bias D.C. potential across capacitance 5 causing the transistor to operate in the class C mode with high efficiency of conversion of D.C. supply power to A.C. output power. The amplitude of oscillation can be controlled by controlling the values of resistances 6 and 7 which control the extent of conduction in the base-emitter diode.

The known circuit of FIG. 1, though often satisfactory, has the defect that, in order to provide the range of amplitude control required in some cases, it is necessary to adopt, at some point in the control range, too high a value for the resistance 6 or for the resistance 7, or both, and if this has to be done trouble may be experienced in operation at high temperatures because of collector-to-base leakage current. The present invention seeks to avoid this defect.

According to this invention a transistor oscillator comprises a transistor, a frequency-selective frequency-dependent network in an oscillation-sustaining feedback path between the output and input electrodes of said transistor, said network having a transfer function dependent on the value or values of at least one reactive component in said network, and means for applying predetermined D.C. bias to the base of said transistor, whereby the value or values of said reactive component or components controls the amplitude of oscillation.

Preferably one reactive component in the frequency-dependent network is arranged to be variable and is employed for varying the oscillation amplitude. This component may conveniently be a saturable reactor varied by varying the saturation thereof.

Preferably also the frequency-dependent network includes an inductance connected in parallel with a capacitance between the collector of the transistor and a source of operating potential therefor, a second condenser in circuit between the base and the emitter of the transistor, and a second inductance in circuit between the base of the transistor and a point of predetermined D.C. bias potential. The second inductance and/or the second capacitance—but preferably only the said inductance—may be variable for varying the oscillation amplitude.

In a preferred embodiment the aforesaid point of predetermined D.C. potential is a tap on a voltage divider which is connected across the source of operating potential, said tap being connected through a choke and the second inductance in series to the transistor base, a blocking condenser being connected between the transistor collector and the junction point of said choke and said second inductance.

A preferred form of R.F. type E.H.T. generator comprises an oscillator in accordance with the invention, means for rectifying output oscillations from said oscillator to constitute E.H.T. output, and means for utilizing a rectified voltage dependent on the oscillatory output from the oscillator for controlling the value of an amplitude-controlling reactance in the feed-back circuit so as to maintain the output oscillations at substantially constant amplitude despite load variations. In a preferred arrangement the rectified voltage is utilized to control the saturation of a saturable inductance constituting the amplitude-controlling reactance.

Referring to FIG. 2, which is a diagram of one embodiment of this invention, it will be seen that the collector circuit of the transistor 1 consists of an inductance 2′ and capacitance 3′ in parallel; a condenser 9 is connected between the base and the emitter of the transistor; the junction point of two resistances 6′ and 7′ which are in series across the source of operating potential, is connected to the transistor base through a radio frequency choke 10 in series with the inductance 8; and a blocking condenser 11 is connected between the transistor collector and the junction point of the elements 8 and 10.

With this improved circuit, feedback of A.C. voltages from the collector to the base of the transistor is via the network 8, 9, 10, 11, 6′ and 7′. Of the elements in this network the resistances 6′ and 7′ provide D.C. bias to the base of the transistor as in FIG. 1. These resistances are of fixed value. The purpose of the choke 10 is to prevent the resistances 6′ and 7′ loading the collector circuits. The condenser 11 acts as a D.C. blocking condenser in the feedback path and also as a reservoir condenser for rectification of A.C. potentials in the base circuit. Elements 8 and 9 in conjunction with the collector tuned circuit 2′ 3′ form the frequency-dependent coupling network between the collector and the base. The improved circuit has the important practical advantage that the values of the resistances 6′ and 7′, which serve merely to provide D.C. bias, can be chosen with full regard to considerations of thermal stability.

FIG. 3 is a theoretical equivalent circuit of FIG. 2. In the equivalent circuit of FIG. 3, the inductance 8 is represented as a series arm inductance L; the elements 2′ and 3′ are represented by the shunt arm inductance $L_p$ and shunt arm capacitance $C_P$; and the condenser 9 is represented by the shunt arm capacitance C. The shunt arm resistances $R_p$ and R represent the losses. $R_p$ can be considered as representing all effective parallel damping across the tuned circuit 2′ 3′ (including the effect of any output load) and R can be considered as representing losses in the elements 8 and 9 and the effective input resistance of the transistor base circuit. These reference letters (except of course $R_p$ and R) in FIG. 3 are included also in FIG. 2 so as the better to identify the various elements.

It may be shown that the embodiment of FIG. 2 as represented in FIG. 3 has a pure real transfer impedance (i.e. ratio of output voltage to input current) at two frequencies given by the roots of the equation:

$$(1+1/a-x^2)(1-x^2ab)=1/a+\frac{x^2}{q\cdot qp}$$

In the above equation:

$$x^2=W^2L_pC_p;\ a=L/L_p;\ b=C/C_p;$$

$$q=\frac{R}{W_oL};\ c_p=\frac{R_p}{W_oL_p};\ W_o^2=\frac{1}{L_pC_p}$$

$$W=2\pi f;\ W_o=2\pi f_o;\ f_o=\frac{1}{2\pi\sqrt{L_p\,C_p}}$$

At the upper of these frequencies, namely that at which $x^2>1+1/a$ and $x^2>1/ab$, the transfer impedance is negative and the network provides correct phase reversal as required for the maintenance of oscillation. The transfer characteristic can be varied over a wide range by variation of the valve of either the inductance 8 or the condenser 9 or both. This is an important property of the network.

The nature of the functional relationship between transfer characteristic and network parameters is complex but is illustrated by practical example in the curves of FIG. 4. In FIG. 4 the upper family of curves connects $x$ with L for various values of the capacitance C and the lower family of curves connects voltage transfer ratio $(-E_2/E_1)$ with L for the same values of C, where $E_2$ is the output voltage, i.e. the voltage across the left hand pair of terminals in FIG. 3, and $E_1$ is the input voltage, i.e., the voltage between the right hand pair of terminals in FIG. 3.

The curves of FIG. 4 are given by way of example only and apply to a circuit corresponding with the equivalent circuit of FIG. 3 and with the following values of circuit elements:

$$L_p=12\ \mu\text{h.};\ C_p=1.7\ \mu\text{f.};\ R_p=130\ \text{ohms};\ R=50\ \text{ohms}$$

It will be seen from FIG. 4 that the voltage transfer ratio can be varied over a considerable range by changing either L or C or both, and this important property enables the amplitude of oscillation to be controlled in a desired manner over a wide range. It will also be noted that the variation in transfer ratio can be effected with only a comparatively small change in the frequency generated if the range of variation of L and/or C is suitably chosen.

It will be apparent to those skilled in the art that the circuit shown in FIG. 2 must be manually adjusted to change the voltage transfer ratio as described above. This can be done by varying either of the elements 8 or 9, and for this purpose both of the elements 8 and 9 are shown as being manually variable. It is preferable, however, to provide means for automatically varying the variable element, either for maintaining the output amplitude constant, or for varying the output amplitude in response to some other variable. It will be apparent to those skilled in the art that the circuit of FIG. 2 has many applications other than the regulation of power supplies.

In practice it is convenient to constitute the inductance L by a saturable reactor and to control the amplitude of oscillation by varying the D.C. polarizing current fed to this reactor. FIG. 5 shows an E.H.T. generator in accordance with this invention wherein this expedient is adopted. The saturable reactor has two coils 8 and 8′ and is varied by feeding to the coil 8′ a control potential obtained by a feedback circuit within the broken line rectangle F. This feedback circuit is largely self explanatory from the figure. As will be seen, generated oscillations induced in the coupling coil 12 are rectified by the diode rectifier 13 and amplified by the auxiliary transistor 14. The output of auxiliary transistor 14 is applied to the control winding 8′ of the saturable reactor, thereby controlling the level of magnetic flux in the coil of the saturable reactor in accordance with the amplitude of the output oscillations from transistor 1. This in turn varies the inducance of the load winding 8 of the saturable reactor in such manner as to compensate for any variations of output amplitude by introducing a corresponding compensating change in the voltage transfer ratio in accordance with the curves illustrated in FIG. 4. As noted above, this regulating action is effected with only a comparatively small change in the output frequency of transistor 1. By means of this negative feedback control loop, the oscillatory amplitude can be maintained constant to a high degree of constancy, despite changes in the external load (not shown) connected to the E.H.T. output terminal "O," without significantly altering the frequency of oscillation.

I claim:

1. In a transistor oscillator including a transistor, a tuned circuit coupled to the collector of said transistor to produce output oscillations at a predetermined frequency, a D.C. bias voltage source coupled to the base of said transistor, and means for applying a feedback signal from the collector to the base of said transistor to sustain said oscillations, the improvement comprising an amplitude control circuit including an inductive circuit element coupled in series between the base of said transistor and said D.C. bias voltage source, a capacitive circuit element coupled between the base and the emitter of said transistor, means for applying said feedback signal from the collector circuit of said transistor to said inductive and capacitive circuit elements, said inductive and capacitive circuit elements being of such value as to produce a predetermined initial transfer characteristic between the input and output of said transistor, one of said circuit elements being variable in value, and means for varying the value of said variable circuit element to vary the amplitude of said output oscillations without significantly altering the frequency thereof by varying said transfer characteristic.

2. The combination defined in claim 1 wherein said last mentioned means comprises means for varying the value of said variable circuit element in accordance with the amplitude of said output oscillations to vary said transfer characteristic in inverse relationship with variations of output amplitude, thereby maintaining the amplitude of said output oscillations substantially constant under varying output load conditions without significantly altering the frequency thereof.

3. The combination defined in claim 2 and also including a choke coupled in series between said inductive circuit element and said D.C. bias voltage source to isolate said D.C. bias voltage source from said feedback and amplitude control circuits.

4. The combination defined in claim 3 wherein said means for applying said feedback signal from the collector circuit of said transistor to said inductive and capacitive circuit elements comprises a capacitor coupled between the collector of said transistor and the junction of said inductive circuit element and said choke.

5. The combination defined in claim 4 wherein said D.C. bias voltage source comprises a D.C. voltage source coupled between the collector and emitter of said transistor, a voltage divider coupled in parallel with said D.C. voltage source, said voltage divider having at least one terminal on which appears, a desired bias voltage level which is lower than the voltage of said D.C. voltage source, and said terminal comprising said D.C. bias voltage source.

6. The combination defined in claim 2 and also including a saturable reactor having a load winding, a saturable core, and a control winding for controlling the inductance of said load winding by controlling the level of magnetic flux in said saturable core, said load winding comprising said inductive circuit element, said control winding comprising a portion of said means for varying the value of said variable circuit element in accordance with the amplitude of said output oscillations, and means for rectifying a portion of the output signal of said transistor and applying said rectified signal to the control winding of said saturable reactor to vary the inductance of said load winding in accordance with the amplitude of said output oscillations.

7. The combination defined in claim 6 wherein the last mentioned means comprises a coupling coil magnetically coupled to the collector circuit of said transistor, rectifier means coupled to said coupling coil for rectifying the signals induced therein by the output oscillations of said transistor, a direct current amplifier coupled to said rectifier means for amplifying said rectified signal, and the output of said direct current amplifier being coupled to the control winding of said saturable reactor to vary the inductance of said load winding in accordance with the amplitude of said output oscillations.

8. The combination defined in claim 7 and also including a choke coupled in series between the load winding of said saturable reactor and said D.C. bias voltage source to isolate said D.C. bias voltage source from said feedback and amplitude regulating circuit.

9. The combination defined in claim 8 wherein said means for applying said feedback signal from the collector circuit of said transistor to said inductive and capacitive circuit elements comprises a capacitor coupled between the collector of said transistor and the junction of said load winding and said choke.

10. The combination defined in claim 9 wherein said D.C. bias voltage source comprises a D.C. voltage source coupled between the collector and emitter of said transistor, a voltage divider coupled in parallel with said D.C. voltage source, said voltage divider having at least one terminal on which appears a desired bias voltage level which is lower than the voltage of said D.C. voltage source, and said terminal comprising said D.C. bias voltage source.

References Cited by the Examiner

UNITED STATES PATENTS

| | | | |
|---|---|---|---|
| 2,661,425 | 12/1953 | Mittelmann | 331—183 |
| 2,773,190 | 12/1956 | De Ruiter | 331—183 X |
| 2,843,746 | 7/1958 | Hofker | 331—183 |
| 2,964,694 | 12/1960 | Adams | 331—183 X |
| 2,975,408 | 3/1961 | Merel | 331—117 X |
| 3,041,512 | 6/1962 | Zeigler et al. | 331—117 X |
| 3,084,294 | 4/1963 | Vallese | 331—109 |
| 3,196,312 | 7/1965 | Marrison | 331—109 X |

NATHAN KAUFMAN, *Primary Examiner.*

ROY LAKE, *Examiner.*

J. B. MULLINS, *Assistant Examiner.*